(12) United States Patent
Jain et al.

(10) Patent No.: US 8,732,637 B2
(45) Date of Patent: May 20, 2014

(54) FORMAL VERIFICATION OF BIT-SERIAL DIVISION AND BIT-SERIAL SQUARE-ROOT CIRCUIT DESIGNS

(75) Inventors: Himanshu Jain, Hillsboro, OR (US); Carl P. Pixley, Beaverton, OR (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/561,895

(22) Filed: Jul. 30, 2012

(65) Prior Publication Data

US 2014/0033150 A1    Jan. 30, 2014

(51) Int. Cl.
| | | |
|---|---|---|
| *G06F 17/50* | (2006.01) | |
| *G06F 9/455* | (2006.01) | |
| *G01R 31/28* | (2006.01) | |
| *G06F 11/00* | (2006.01) | |
| *G06F 7/02* | (2006.01) | |

(52) U.S. Cl.
USPC .......... 716/106; 716/101; 716/107; 716/111; 716/123; 716/136; 714/724; 714/799; 714/819

(58) Field of Classification Search
USPC .......... 716/101, 106, 107, 123; 714/724, 799, 714/819
See application file for complete search history.

(56) References Cited

U.S. PATENT DOCUMENTS

| | | | | |
|---|---|---|---|---|
| 5,091,908 A | * | 2/1992 | Zorian | 714/722 |
| 5,493,506 A | * | 2/1996 | Sakashita et al. | 716/121 |
| 5,644,639 A | * | 7/1997 | Naciri et al. | 380/30 |
| 6,060,936 A | * | 5/2000 | Raghunath | 327/360 |
| 6,101,621 A | * | 8/2000 | Kondo | 714/724 |
| 6,523,053 B1 | * | 2/2003 | Lee et al. | 708/492 |
| 6,571,368 B1 | * | 5/2003 | Chen | 714/784 |
| 6,748,507 B2 | * | 6/2004 | Matsubara et al. | 711/167 |
| 7,107,190 B1 | * | 9/2006 | Tsuchiya et al. | 703/1 |
| 7,818,699 B1 | * | 10/2010 | Stuber et al. | 716/123 |
| 7,890,903 B2 | * | 2/2011 | Weber et al. | 716/106 |

(Continued)

FOREIGN PATENT DOCUMENTS

JP         63190356 A   *   8/1988   .............. H01L 21/82

OTHER PUBLICATIONS

Juang et al.; "A novel VLSI iterative divider architecture for fast quotient generation"; Publication Year: 2008; Circuits and Systems, 2008. ISCAS 2008. IEEE International Symposium on; pp. 3358-3361.*

(Continued)

*Primary Examiner* — Helen Rossoshek
(74) *Attorney, Agent, or Firm* — Park, Vaughan, Fleming & Dowler LLP; Laxman Sahasrabuddhe

(57) ABSTRACT

Methods and apparatuses are described for formally verifying a bit-serial division circuit design or a bit-serial square-root circuit design. Some embodiments formally verify a bit-serial division circuit design using a set of properties that can be efficiently proven using a bit-level solver. In some embodiments, the set of properties that are used for verifying a bit-serial division circuit design does not include any terms that multiply a w-bit partial quotient with the divisor. Some embodiments formally verify a bit-serial square-root circuit design using a set of properties that can be efficiently proven using a bit-level solver. In some embodiments, the set of properties that are used for verifying a bit-serial square-root circuit design does not include any terms that compute a square of a w-bit partial square-root.

20 Claims, 2 Drawing Sheets

Create a set of properties to prove correctness of a bit-serial division circuit design, wherein the set of properties are capable of being efficiently proven by using a bit-level solver
202

Perform formal verification of the bit-serial division circuit design by attempting to prove the set of properties
204

(56) References Cited

U.S. PATENT DOCUMENTS

| | | | | |
|---|---|---|---|---|
| 8,312,361 | B2* | 11/2012 | Kamoshida | 714/799 |
| 8,402,078 | B2* | 3/2013 | Weinberg et al. | 708/650 |
| 8,415,968 | B2* | 4/2013 | Swartzlander et al. | 326/6 |
| 8,429,589 | B2* | 4/2013 | Croysdale et al. | 716/126 |
| 8,527,573 | B2* | 9/2013 | Dondini et al. | 708/650 |
| 8,527,923 | B1* | 9/2013 | Akbarpour et al. | 716/107 |
| 2005/0270865 | A1* | 12/2005 | Boldt et al. | 365/200 |
| 2010/0318592 | A1* | 12/2010 | Han et al. | 708/235 |
| 2010/0332957 | A1* | 12/2010 | Kamoshida | 714/819 |
| 2013/0200921 | A1* | 8/2013 | Swartzlander et al. | 326/6 |

OTHER PUBLICATIONS

Choo et al.; "A parallel series approximation scheme for a fast floating point divider"; Publication Year: 2001; SoutheastCon 2001. Proceedings. IEEE; pp. 202-207.*

Nienhaus et al.; "A parallel SRT divider for systolic linear system solvers"; Publication Year: 1989;Southeastcon '89. Proceedings. Energy and Information Technologies in the Southeast., IEEE; pp. 1361-1365 vol. 3.*

Wey; "Design and test generation of C-testable high-speed carry-free dividers"; Publication Year: 1995; Computers and Digital Techniques, IEE Proceedings-; vol. 142 , Issue: 3; pp. 193-200.*

Takagi et al.; "An on-line error-detectable array divider with a redundant binary representation and a residue code"; Publication Year: 1988; Fault-Tolerant Computing, 1988. FTCS-18, Digest of Papers., Eighteenth International Symposium on; pp. 174-179.*

Bryant, R.E.; "Bit-level analysis of an SRT divider circuit"; Publication Year: 1996; Design Automation Conference; Proceedings 1996, 33rd; pp. 661-665.*

Kroening et al.; "Formal verification at higher levels of abstraction"; Publication Year: 2007; Computer-Aided Design, 2007. ICCAD 2007. IEEE/ACM International Conference on; pp. 572-578.*

* cited by examiner

Create a set of properties to prove correctness of a bit-serial division circuit design, wherein the set of properties are capable of being efficiently proven by using a bit-level solver
202

Perform formal verification of the bit-serial division circuit design by attempting to prove the set of properties
204

FORMAL VERIFICATION OF BIT-SERIAL DIVISION AND BIT-SERIAL SQUARE-ROOT CIRCUIT DESIGNS

BACKGROUND

1. Technical Field

This disclosure generally relates to formal verification. More specifically, this disclosure relates to formal verification of bit-serial division and bit-serial square root circuit designs.

2. Related Art

The importance of circuit verification cannot be over-emphasized. Indeed, without circuit verification it would have been practically impossible to design complicated integrated circuits (ICs) which are commonly found in today's computing devices.

Circuits that perform division and that compute a square root are used extensively in ICs. For example, these circuits are commonly used in central processing units (CPUs), graphics processors, digital signal processors, etc. There have been many cases in which a bug in a circuit implementation of a mathematical operator had a significant impact on the company's finances. For example, in one well-publicized instance, a bug in a floating-point division circuit cost the company hundreds of millions of dollars. Therefore, it is very important to guarantee that certain circuits (e.g., division and square root circuits) in an IC will operate correctly.

One approach to verify a circuit design is to exhaustively simulate the circuit design. However, this approach is clearly impractical because it is computationally infeasible (and often impossible) to exhaustively simulate non-trivial circuit designs such division circuit designs and square-root circuit designs.

Another approach uses formal verification to prove correctness of a circuit design. Unfortunately, naïve formal verification based approaches can have serious runtime and memory issues when they are used to prove correctness of division and square-root circuit designs. Hence, what is needed are techniques and systems for formally verifying division and square-root circuit designs without the above-described problems.

SUMMARY

Embodiments described in this disclosure provide methods and apparatuses for formally verifying a bit-serial division circuit design or a bit-serial square-root circuit design using a bit-level solver.

A bit-serial division circuit design receives a dividend and a divisor as input, and outputs a w-bit quotient and a remainder by performing an iterative computation. In each iteration of the iterative computation, the bit-serial division circuit design determines b bits of the w-bit quotient, where b<w. Some embodiments create a set of properties to prove correctness of a bit-serial division circuit design, wherein the set of properties can be efficiently proven using a bit-level solver. The embodiments then formally verify the bit-serial division circuit design using the set of properties.

A bit-serial square-root circuit design receives a square-root operand as input, and outputs a w-bit square-root by performing an iterative computation. In each iteration of the iterative computation, the bit-serial square-root circuit design determines b bits of the w-bit square-root, where b<w. Some embodiments create a set of properties to prove correctness of a bit-serial square-root circuit design, wherein the set of properties can be efficiently proven using a bit-level solver. The embodiments then formally verify the bit-serial square-root circuit design using the set of properties.

DETAILED DESCRIPTION

Figures 1, 2:
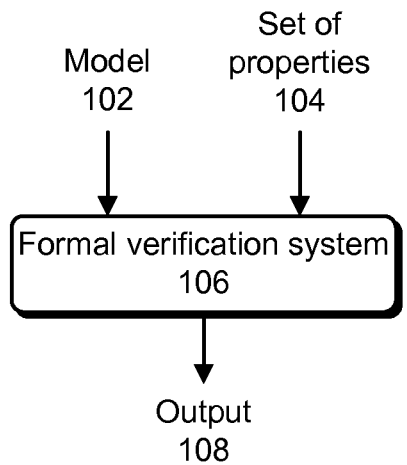
FIG. 1 illustrates a formal verification system in accordance with some embodiments described herein.
FIG. 2 illustrates a process for proving correctness of a bit-serial division circuit design in accordance with some embodiments described herein.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Overview of an Electronic Design Automation (EDA) Flow

An EDA flow can be used to create a circuit design. Once the circuit design is finalized, it can undergo fabrication, packaging, and assembly to produce integrated circuit chips. An EDA flow can include multiple steps, and each step can involve using one or more EDA software tools. Some EDA steps and software tools are described below. These examples of EDA steps and software tools are illustrative purposes only and are not intended to limit the embodiments to the forms disclosed.

Some EDA software tools enable circuit designers to describe the functionality that they want to implement. These tools also enable circuit designers to perform what-if planning to refine functionality, check costs, etc. During logic design and functional verification, the HDL (hardware description language), e.g., SystemVerilog, code for modules in the system can be written and the design can be checked for functional accuracy, e.g., the design can be checked to ensure that it produces the correct outputs.

During synthesis and design for test, the HDL code can be translated to a netlist using one or more EDA software tools. Further, the netlist can be optimized for the target technology, and tests can be designed and implemented to check the finished chips. During netlist verification, the netlist can be checked for compliance with timing constraints and for correspondence with the HDL code.

During design planning, an overall floorplan for the chip can be constructed and analyzed for timing and top-level routing. During physical implementation, circuit elements can be positioned in the layout (placement) and can be electrically coupled (routing).

During analysis and extraction, the circuit's functionality can be verified at a transistor level and parasitics can be extracted. During physical verification, the design can be checked to ensure correctness for manufacturing, electrical issues, lithographic issues, and circuitry.

During resolution enhancement, geometric manipulations can be performed on the layout to improve manufacturability of the design. During mask data preparation, the design can be "taped-out" to produce masks which are used during fabrication.

Formal Verification

In a circuit design flow, a circuit design is represented at different levels of abstractions. For example, some circuit design flows begin by writing an IC design specification in a high-level programming language, such as C, C++, SystemC, SystemVerilog, etc. Such high-level descriptions of the circuit design are often referred to as a high-level model (HLM) for the IC design. The level of abstraction decreases as the circuit design progresses through the design flow. For example, a circuit design which is represented using an HLM at the beginning of the design flow may be represented using a register-transfer-level (RTL) model at a later stage in the design flow.

Formal verification techniques can be used to prove the correctness of a circuit design at one or more levels of abstraction. For example, embodiments described herein can be used to verify an HLM or an RTL model of a bit-serial division circuit design or a bit-serial square-root circuit design.

Whenever the same circuit design is represented at different levels of abstraction, it is important to verify that the models at different abstraction levels are functionally equivalent. For example, when an HLM for a circuit design is converted into an RTL model, it is important to ensure that the two models are functionally equivalent. Some embodiments described herein can be used in a functional equivalence verification system that verifies whether or not two different models of a division circuit design or a square-root circuit design are functionally equivalent.

FIG. 1 illustrates a formal verification system in accordance with some embodiments described herein.

The formal verification system 106 receives two inputs. The first input is a model 102 of a circuit design. The second input is a set of properties 104 that are to be proven based on model 102 of the circuit design. Set of properties 104 includes a set of one or more mathematical and/or logical relationships between entities in model 102 that specify the correct behavior of the circuit design. In other words, proving the set of properties 104 is equivalent to proving correctness of model 102.

For example, if model 102 is a HLM, then set of properties 104 may include one or more mathematical and/or logical statements that are defined over the set of variables used in model 102. If model 102 is an RTL model, then set of properties 104 may include one or more mathematical and/or logical statements that are defined over the values of registers and/or signals in model 102.

Formal verification system 106 attempts to prove set of properties 104 based on model 102, and produces output 108. If formal verification system 106 is successful in proving set of properties 104, then output 108 indicates that model 102 has been verified. If formal verification system 106 is able to disprove one or more properties (e.g., by determining one or more counterexample traces that violate one or more properties), then output 108 indicates that model 102 is not correct, and may provide the counterexample traces, if any. Finally, if formal verification system 106 is not able to either prove or disprove model 102 (e.g., because the formal verification system ran out of time or memory), then output 108 indicates that model 102 was not proven or disproven, and may provide a reason why formal verification failed.

The correct behavior of a circuit design can be specified using different sets of properties. In many cases, the runtime and memory resources required by a formal verification system can be vastly different for different set of properties. For example, suppose we want to verify whether or not a circuit design correctly performs a particular operation (e.g., division or square-root). Further, suppose this operation can be verified by proving either the set of properties P1 or the set of properties P2. Then, there are many cases in which a verification system can take significantly more time and/or memory to prove the set of properties P1 than it would take to prove the set of properties P2.

Oftentimes the types of mathematical and/or logical operations that are used in the set of properties determine whether or not a formal verification system is able to prove or disprove the set of properties efficiently. For example, if the set of properties includes a word-level multiplication operator, then a formal verification system that uses a bit-level solver (e.g., a binary decision diagram (BDD) or satisfiability based solver) is unlikely to be able to efficiently prove or disprove the set of properties.

Some embodiments described herein provide techniques for creating set of properties 104 for a bit-serial division circuit design and a bit-serial square-root circuit design, such that set of properties 104 can be efficiently proven or disproven by a formal verification system that uses a bit-level solver.

Formal Verification of Bit-Serial Division Circuit Designs

A division circuit design takes two inputs, namely the dividend (X) and the divisor (D), and produces two outputs, namely the quotient (Q) and the remainder (R). Proving the following set of properties is sufficient to prove that an implementation of a division circuit design operates correctly:

$$X = Q \times D + R, \text{ and}$$

$$R < D. \quad (1)$$

In the above equation, X, D, Q, and R are non-negative integers. Extending the equation to signed numbers will be apparent to a person having ordinary skill in the art. Specifically, in some implementations, the absolute values of X and D are used in the division, and then appropriate signs (i.e., positive or negative) are attached to the quotient and remainder based on the signs of dividend and the divisor. A bit-serial division circuit design implements an iterative process to determine the quotient and the remainder. In each iteration, one or more bits of the quotient are determined. For example, in some embodiments, a single bit of the quotient is determined in each iteration by the bit-serial division circuit design. In each iteration, a partial remainder is maintained. At the end of the last iteration the partial remainder becomes equal to the actual remainder.

A bit-serial division process determines the bits of the quotient by starting from the most significant bit and then progressively moving toward the least significant bit in each iteration. For example, in embodiments where a single bit is determined in each iteration, the first iteration (i.e., i=1) determines the most significant bit of Q, and the last iteration determines the least significant bit of Q. In embodiments where b bits are determined in each iteration, the first iteration (i.e., i=1) determines the b most significant bits of Q, the second iteration (i.e., i=2) determines the next b most significant bits of Q, and so forth until all bits of Q have been determined. In each iteration, a partial remainder is maintained. At the start of the first iteration, the partial remainder is equal to the dividend. The partial remainder reduces in value in each iteration and converges to the correct remainder in the last iteration.

Let Q[i] and R[i] denote the partial quotient and partial remainder, respectively, in iteration i. In other words, Q[i] represents the value of the quotient Q in iteration i of the iterative bit-serial division process. Likewise, R[i] represents the value of the remainder R in iteration i of the iterative bit-serial division process. As the iterative process progresses, the values of the partial quotient Q[i] and the partial remainder R[i] change, and they become equal to the quotient and the remainder after the last iteration is completed.

Suppose the quotient Q is w-bits wide. Let us assume that, in each iteration, the bit-serial division process determines b bits of the quotient Q. In these embodiments, the bit-serial division process will require $$k = \lceil \frac{w}{b} \rceil$$

iterations to determine the final value for the quotient and the remainder.

The following discussion assumes, without loss of generality, that b=1. It will be apparent to those skilled in the art that the systems and techniques described in this disclosure can also be used for bit-serial division circuit designs in which b>1.

The following set of properties can be used to prove correctness of a bit-serial division circuit design:

$$X = Q[i] \times D + R[i], \text{ and} \quad (2)$$

$$R[i] < (2^{k-i} \times D). \quad (3)$$

The sets of properties (2) and (3) shown above are proven for $\forall i, 0 \le i \le k$. Note that, since b=1, k=w. When i=0, it is assumed that Q[0]=0 and R[0]=X. The term Q[i]×D uses a word-level multiplication operator which causes performance problems in formal verification systems that use bit-level solvers. Note that the word-level multiplication $2^{k-i} \times D$ that is used in the set of properties (3) can be performed by using a left-shift operation, and therefore does not cause performance problems during formal verification when bit-level solvers are used.

In lieu of the set of properties (2) shown above, some embodiments described herein use a different set of properties that can be proven or disproven efficiently by using a bit-level solver. Specifically, let q[j] be the $j^{th}$ bit of quotient Q, where q[0] is the least significant bit of Q and q[k−1] is the most significant bit of Q (recall that since b=1, therefore k=w, where w is the number of bits in Q). Some embodiments described herein use the following set of properties in lieu of the set of properties (2) to prove correctness of a bit-serial division circuit design:

$$X = R[0], \quad (4)$$
$$R[0] = (q[k-1] \times 2^{k-1}) \times D + R[1],$$
$$R[1] = (q[k-2] \times 2^{k-2}) \times D + R[2],$$
$$\vdots$$
$$R[k-1] = (q[0] \times 2^0) \times D + R[k].$$

Note that bit q[k−i] is equal to either 0 or 1, and so the expression q[k−i]×$2^{k-i}$ is equal to either 0 or $2^{k-i}$. Therefore, the word-level multiplication (q[k−i]×$2^{k-i}$)×D can be performed by using a left-shift operation when q[k−i] is equal to 1. For this reason, the expression (q[k−i]×$2^{k-i}$)×D does not cause performance problems during formal verification.

An important insight that was used to arrive at the set of properties (4) shown above is as follows. From the set of properties (2) we know that X=Q[i−1]×D+R[i−1] and X=Q[i]×D+R[i]. Substituting the value of X from the first equation into the second equation, we get Q[i−1]×D+R[i−1]=Q[i]×D+R[i]. After rearranging the terms, we get R[i−1]=(Q[i]−Q[i−1])×D+R[i]. Note that (Q[i]−Q[i−1]) is a binary value in which all bits are equal to zero except possibly the bit q[k−i] that was determined in the $i^{th}$ iteration. In other words, Q[i]−Q[i−1]=q[k−i]×$2^{k-i}$. This is an important insight that is used by some embodiments described herein.

Another important insight is that the set of properties (4) are equivalent to set of properties (2). This can be readily verified by summing the left hand sides and the right hand sides of the equations shown in the set of properties (4), and then canceling terms that appear on both sides of the equation. The partial remainder terms R[0], . . . , R[k−1] cancel out, and we get:

$$X = (q[k-1] \times 2^{k-i}) \times D + \ldots + (q[0] \times 2^0) \times D + R[k] = Q[k] \times D + R[k]. \quad (5)$$

FIG. 2 illustrates a process for proving correctness of a bit-serial division circuit design in accordance with some embodiments described herein. The bit-serial division circuit design receives a dividend and a divisor as input, and outputs a w-bit quotient and a remainder by performing an iterative computation. In each iteration of the iterative computation, the bit-serial division circuit design determines b bits of the w-bit quotient. The bit-widths used above are for illustration purposes only and are not intended to restrict the embodiments to the forms disclosed. It will be apparent to those having ordinary skill in the art that the systems and techniques described in this disclosure can also be used for proving bit-serial division circuit designs in which the bit-widths of dividend and divisor are different from the bit-widths used in this disclosure.

The process begins by creating a set of properties to prove correctness of the bit-serial division circuit design, wherein the set of properties are capable of being efficiently proven by using a bit-level solver (process block 202). Specifically, in some embodiments, the set of properties does not include any terms that multiply a w-bit partial quotient with the divisor. For example, the set of properties (3)-(4) shown above does not include any terms that multiply a w-bit partial quotient with the divisor. Next, formal verification is performed on the bit-serial division circuit design by attempting to prove the set of properties (process block 204).

In some embodiments, the set of properties includes terms that multiply a b-bit value (i.e., the b bits of the quotient that were determined in the current iteration) with the divisor. Note that 1≤b<w. When b=1, the set of properties only includes terms that are capable of being evaluated using an addition operation and a left-shift operation.

In some embodiments, a bit-level solver is used to prove the set of properties. The term "bit-level solver" generally refers to any system that uses a bit-level computational model to prove or disprove a set of properties. Examples of bit-level solvers include, but are not limited to, BDD-based solvers and satisfiability (SAT)-based solvers.

The systems and techniques described herein are applicable to both restoring and non-restoring bit-serial division circuit designs. The set of properties (4) shown above correspond to a restoring bit-serial division circuit design.

In a restoring bit-serial division, the partial remainder is always non-negative. In a non-restoring bit-serial division, the partial remainders can become negative. Let NQ[i] and NR[i] denote the quotient and the remainder, respectively, in a non-restoring bit-serial division circuit design. In non-restoring bit-serial division circuit designs, additional logic is added to the circuit design to derive restoring quotient Q[i] and restoring remainder R[i] from NQ[i] and NR[i]. The additional logic does not change the functionality of the original design. The values Q[i] and R[i] are then used to prove the set of properties (3)-(4) shown above.

Formal Verification of Bit-Serial Square-Root Circuit Designs

A square-root circuit design takes one input (X) and produces one output (Q). Proving the following property is sufficient to prove that an implementation of a square-root circuit design operates correctly:

$$Q^2 \leq X < (Q+1)^2. \tag{6}$$

Property (6) shown above is equivalent to the following set of properties where R denotes the remainder:

$$X = Q^2 + R,$$

$$0 \leq R < (2 \cdot Q + 1). \tag{7}$$

A bit-serial square-root circuit design implements an iterative process to determine the square-root (Q). In each iteration, one or more bits of the square-root are determined. For example, in some embodiments, a single bit of Q is determined in each iteration by the bit-serial square-root circuit design. In each iteration, a partial remainder is maintained. At the end of the last iteration the partial remainder becomes equal to the remainder (denoted by R in set of properties (7)).

A bit-serial square-root process determines the bits of the square-root by starting from the most significant bit and then progressively moving toward the least significant bit in each iteration. For example, in embodiments where a single bit is determined in each iteration, the first iteration (i.e., i=1) determines the most significant bit of Q, and the last iteration determines the least significant bit of Q. In embodiments where b bits are determined in each iteration, the first iteration (i.e., i=1) determines the b most significant bits of Q, the second iteration (i.e., i=2) determines the next b most significant bits of Q, and so forth until all bits of Q have been determined. In each iteration, a partial remainder is maintained. At the start of the first iteration the partial remainder is equal to the input X. The partial remainder reduces in value in each iteration and converges to the correct remainder in the last iteration.

Let Q[i] and R[i] denote the partial square-root and partial remainder, respectively, corresponding to iteration i. In other words, Q[i] represents the value of the square-root Q in iteration i of the iterative bit-serial division process. As the iterative process progresses, the value of the partial square-root Q[i] changes, and it becomes equal to the square root of the input (X) after the last iteration is completed. Likewise, the value of the partial remainder R[i] changes as the iteration progresses, and becomes equal to the remainder (R) after the last iteration is completed.

Suppose the square-root Q is a w-bit value. Let us assume that, in each iteration, the bit-serial square-root process determines b bits of the square-root Q. In these embodiments, the bit-serial square-root process will require $$k = \left\lceil \frac{w}{b} \right\rceil$$

iterations to determine the final value of the square-root.

The following discussion assumes, without loss of generality, that b=1. It will be apparent to those skilled in the art that the systems and techniques described in this disclosure can also be used for bit-serial square-root circuit designs in which b>1.

The following set of properties can be used to prove correctness of a bit-serial square-root circuit design:

$$X = (Q[i])^2 + R[i], \tag{8}$$

$$R[i] < ((2 \times Q[i]) + 1) \times 2^{2k-2i}), \tag{9}$$

$$R[i] \geq 0. \tag{10}$$

The sets of properties (8)-(10) shown above are proven for $\forall i, 0 \leq i \leq k$. Note that, since b=1, k=w. When i=0, it is assumed that Q[0]=0 and R[0]=X The term $(Q[i])^2$ uses a word-level multiplication operator which causes performance problems in formal verification systems that use bit-level solvers. Note that the term $((2 \times Q[i]) + 1) \times 2^{2k-2i})$ does not cause performance problems during formal verification because multiplication by a power of 2 can be performed by using a left-shift operation.

In lieu of the set of properties (8) shown above, some embodiments described herein use a different set of properties that can be proven or disproven efficiently by using a bit-level solver. Specifically, let q[j] be the $j^{th}$ bit of square-root Q, where q[0] is the least significant bit of Q and q[k−1] is the most significant bit of Q (recall that since b=1, therefore k=w, where w is the number of bits in Q). Some embodiments described herein use the following set of properties in lieu of set of properties (8) to prove correctness of a bit-serial square-root circuit design:

$$\begin{aligned}
X &= R[0], \\
R[0] &= (q[k-1] \times (2 \cdot Q[0] + q[k-1] \cdot 2^{k-1}) \times 2^{k-1}) + R[1], \\
R[1] &= (q[k-2] \times (2 \cdot Q[1] + q[k-2] \cdot 2^{k-2}) \times 2^{k-2}) + R[2], \\
&\vdots \\
R[i-1] &= (q[k-i] \times (2 \cdot Q[i-1] + q[k-i] \cdot 2^{k-i}) \times 2^{k-i}) + R[i], \\
&\vdots \\
R[k-1] &= (q[0] \times (2 \cdot Q[k-1] + q[0] \cdot 2^0) \times 2^0) + R[k].
\end{aligned} \tag{11}$$

The set of properties (11) shown above is proven for $\forall i, 1 \leq i \leq k$. Note that bit q[k−i] is equal to either 0 or 1, and so the expression $(q[k-i] \times (2 \cdot Q[i-1] + q[k-i] \cdot 2^{k-i}) \times 2^{k-i})$ involves a multiplication by a power of 2 when q[k−i] is equal to 1, and therefore can be evaluated by using a left-shift operation. Hence, the expression $(q[k-i] \times (2 \cdot Q[i-1] + q[k-i] \cdot 2^{k-i}) \times 2^{k-i})$ does not cause performance problems during formal verification when bit-level solvers are used.

Some important insights that were used to arrive at the set of properties (11) shown above are as follows. From the set of properties (8) we know that $X = (Q[i-1])^2 + R[i-1]$ and $X = (Q[i])^2 + R[i]$. Substituting the value of X from the first equation into the second equation, we get $(Q[i-1])^2 + R[i-1] = (Q[i])^2 + R[i]$. After rearranging the terms, we get $R[i-1] = ((Q[i])^2 - (Q[i-1])^2) + R[i]$. Rewriting the expression $(Q[i])^2 - (Q[i-1])^2$, we obtain $R[i-1] = (Q[i] + Q[i-1]) \times (Q[i] - Q[i-1]) + R[i]$. Note that $(Q[i] - Q[i-1])$ is equal to a binary value in which all bits are equal to zero except possibly the bit q[k−i] that was determined in the $i^{th}$ iteration. In other words, $Q[i] - Q[i-1] = q[k-i] \times 2^{k-i}$. Furthermore, note that $(Q[i] + Q[i-1])$ is equal to $(2 \cdot Q[i-1] + q[k-i] \cdot 2^{k-i})$, which leads us to the set of properties (11) shown above.

Another important insight is that the set of properties (11) are equivalent to set of properties (8). This can be readily verified by summing the left hand sides and the right hand sides of the equations shown in the set of properties (11), and then canceling terms that appear on both sides of the equation. The partial remainder terms R[0], . . . , R[k−1] cancel out, and we are left with $X=(Q[k])^2+R[k]$.

Figure 3:
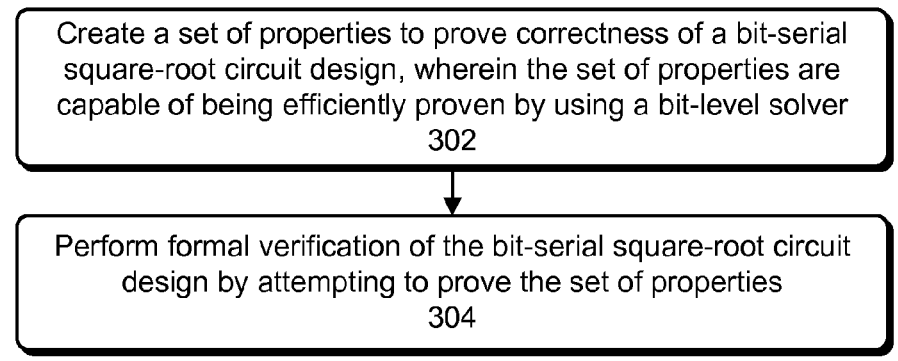
FIG. 3 illustrates a process for proving correctness of a bit-serial square-root circuit design in accordance with some embodiments described herein.

FIG. 3 illustrates a process for proving correctness of a bit-serial square-root circuit design in accordance with some embodiments described herein. The bit-serial square-root circuit design receives a 2w-bit value as input, and outputs a w-bit square-root by performing an iterative computation. In each iteration of the iterative computation, the bit-serial square-root circuit design determines b bits of the w-bit square-root.

The process begins by creating a set of properties to prove correctness of the bit-serial square-root circuit design, wherein the set of properties are capable of being efficiently proven by using a bit-level solver (process block 302). In some embodiments, the set of properties does not include any terms that compute a square of a w-bit partial square-root. For example, the set of properties (9)-(11) shown above does not include any terms that compute a square of a w-bit partial square-root. Next, formal verification is performed on the bit-serial square-root circuit design by attempting to prove the set of properties (process block 304).

In some embodiments, the set of properties includes terms that multiply a b-bit value (i.e., the b bits of the partial square-root that were determined in the current iteration) with the w-bit partial square-root. Note that $1 \leq b < w$. When b=1, the set of properties only includes terms that are capable of being evaluated using an addition operation and a left-shift operation.

In a restoring bit-serial square root computation, the partial remainder is always non-negative. In a non-restoring bit-serial square root computation, the partial remainders can become negative. Let NQ[i] and NR[i] denote the quotient and the remainder, respectively, in a non-restoring bit-serial square root circuit design. In non-restoring bit-serial square root circuit designs, additional logic is added to the circuit design to derive restoring quotient Q[i] and restoring remainder R[i] from NQ[i] and NR[i]. The additional logic does not change the functionality of the original design. The values Q[i] and R[i] are then used to prove the set of properties (9)-(11) shown above.

Computer System

Figure 4:
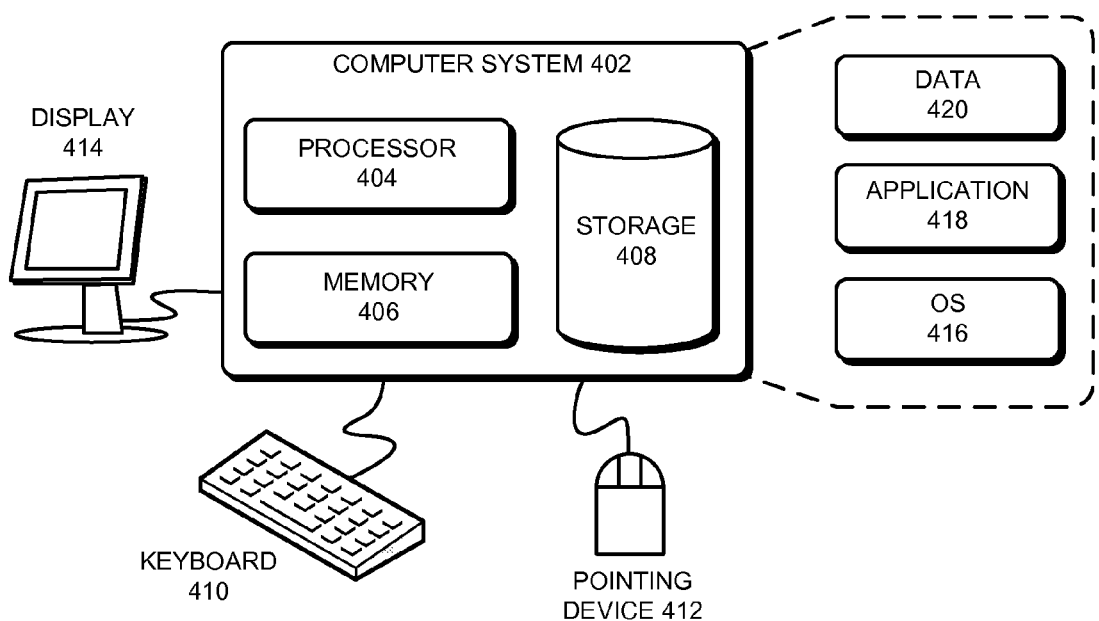
FIG. 4 illustrates a computer system in accordance with some embodiments described in this disclosure.

FIG. 4 illustrates a computer system in accordance with some embodiments described in this disclosure. Computer system 402 can include processor 404, memory 406, and storage device 408. Computer system 402 can be coupled to display device 414, keyboard 410, and pointing device 412. Storage device 408 can store operating system 416, application 418, and data 420. Data 420 can include input required by application 418 and/or output generated by application 418.

Computer system 402 may automatically perform any method that is implicitly or explicitly described in this disclosure. Specifically, during operation, computer system 402 can load application 418 into memory 406. Application 418 can then be used by a user to create a set of properties for proving correctness of a bit-serial division circuit design or a bit-serial square-root circuit design. Next, application 418 can be used to perform formal verification of the bit-serial division circuit design or the bit-serial square-root circuit design by proving the set of properties.

CONCLUSION

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for proving correctness of a bit-serial division circuit design, the method comprising:

creating a set of properties to prove correctness of the bit-serial division circuit design, wherein the set of properties can be efficiently proven by using a bit-level solver, wherein the bit-serial division circuit design receives a dividend and a divisor as input, wherein the bit-serial division circuit design outputs a w-bit quotient and a remainder by performing an iterative computation, and wherein in each iteration of the iterative computation, the bit-serial division circuit design determines b bits of the w-bit quotient, wherein b is less than w, and wherein b and w are integers; and performing, by computer, formal verification of the bit-serial division circuit design by attempting to prove the set of properties using the bit-level solver.

2. The method of claim 1, wherein the set of properties does not include any terms that multiply a w-bit partial quotient with the divisor.

3. The method of claim 1, wherein the set of properties includes terms that multiply b bits of a w-bit partial quotient that were determined in a given iteration with the divisor.

4. The method of claim 1, wherein the bit-level solver is a BDD-based bit-level solver.

5. The method of claim 1, wherein the bit-level solver is a satisfiability (SAT)-based bit-level solver.

6. A non-transitory computer-readable storage medium storing instructions that, when executed by a computer, cause the computer to perform a method for proving correctness of a bit-serial division circuit design, the method comprising:

creating a set of properties to prove correctness of the bit-serial division circuit design, wherein the set of properties can be efficiently proven by using a bit-level solver, wherein the bit-serial division circuit design receives a dividend and a divisor as input, wherein the bit-serial division circuit design outputs a w-bit quotient and a remainder by performing an iterative computation, and wherein in each iteration of the iterative computation, the bit-serial division circuit design determines b bits of the w-bit quotient, wherein b is less than w, and wherein b and w are integers; and performing formal verification of the bit-serial division circuit design by attempting to prove the set of properties using the bit-level solver.

7. The non-transitory computer-readable storage medium of claim 6, wherein the set of properties does not include any terms that multiply a w-bit partial quotient with the divisor.

8. The non-transitory computer-readable storage medium of claim 6, wherein the set of properties includes terms that multiply b bits of a w-bit partial quotient that were determined in a given iteration with the divisor.

9. The non-transitory computer-readable storage medium of claim 6, wherein the bit-level solver is a BDD-based bit-level solver.

10. The non-transitory computer-readable storage medium of claim 6, wherein the bit-level solver is a satisfiability (SAT)-based bit-level solver.

11. A method for proving correctness of a bit-serial square-root circuit design, the method comprising:

creating a set of properties to prove correctness of the bit-serial square-root circuit design, wherein the set of properties can be efficiently proven by using a bit-level solver, wherein the bit-serial square-root circuit design receives a square-root operand as input, wherein the bit-serial square-root circuit design outputs a w-bit square-root by performing an iterative computation, and wherein in each iteration of the iterative computation, the bit-serial square-root circuit design determines b bits of the w-bit square-root, wherein b is less than w, and wherein b and w are integers; and performing, by computer, formal verification of the bit-serial square-root circuit design by attempting to prove the set of properties using the bit-level solver.

12. The method of claim 11, wherein the set of properties does not include any terms that compute a square of a w-bit partial square-root.

13. The method of claim 11, wherein the set of properties includes terms that multiply b bits of a w-bit partial square-root that were determined in a given iteration with the w-bit partial square-root.

14. The method of claim 11, wherein the bit-level solver is a BDD-based bit-level solver.

15. The method of claim 11, wherein the bit-level solver is a satisfiability (SAT)-based bit-level solver.

16. A non-transitory computer-readable storage medium storing instructions that, when executed by a computer, cause the computer to perform a method for proving correctness of a bit-serial square-root circuit design, the method comprising:

creating a set of properties to prove correctness of the bit-serial square-root circuit design, wherein the set of properties can be efficiently proven by using a bit-level solver, wherein the bit-serial square-root circuit design receives a square-root operand as input, wherein the bit-serial square-root circuit design outputs a w-bit square-root by performing an iterative computation, and wherein in each iteration of the iterative computation, the bit-serial square-root circuit design determines b bits of the w-bit square-root, wherein b is less than w, and wherein b and w are integers; and performing, by computer, formal verification of the bit-serial square-root circuit design by attempting to prove the set of properties using the bit-level solver.

17. The non-transitory computer-readable storage medium of claim 16, wherein the set of properties does not include any terms that compute a square of a w-bit partial square-root.

18. The non-transitory computer-readable storage medium of claim 16, wherein the set of properties includes terms that multiply b bits of a w-bit partial square-root that were determined in a given iteration with the w-bit partial square-root.

19. The non-transitory computer-readable storage medium of claim 16, wherein the bit-level solver is a BDD-based bit-level solver.

20. The non-transitory computer-readable storage medium of claim 16, wherein the bit-level solver is a satisfiability (SAT)-based bit-level solver.

* * * * *